United States Patent
Roden et al.

(10) Patent No.: US 8,463,341 B2
(45) Date of Patent: Jun. 11, 2013

(54) SUPERCONDUCTING ELEMENT JOINT, A PROCESS FOR PROVIDING A SUPERCONDUCTING ELEMENT JOINT AND A SUPERCONDUCTING CABLE SYSTEM

(75) Inventors: Mark Roden, Newnan, GA (US); Jerry C. Tolbert, Carrollton, GA (US); Carsten Thidemann Nielsen, Jaegerspris (DK); Chresten Traeholt, Frederiksberg (DK)

(73) Assignee: NKT Cables Ultera A/S, Asnaes (DK)

( * ) Notice: Subject to any disclaimer, the term of this patent is extended or adjusted under 35 U.S.C. 154(b) by 621 days.

(21) Appl. No.: 12/665,095

(22) PCT Filed: Jun. 23, 2008

(86) PCT No.: PCT/DK2008/000235
§ 371 (c)(1), (2), (4) Date: Apr. 8, 2010

(87) PCT Pub. No.: WO2009/000269
PCT Pub. Date: Dec. 31, 2008

(65) Prior Publication Data
US 2010/0184604 A1 Jul. 22, 2010

Related U.S. Application Data

(60) Provisional application No. 60/953,256, filed on Aug. 1, 2007, provisional application No. 60/929,340, filed on Jun. 22, 2007.

(51) Int. Cl.
*H01L 23/48* (2006.01)

(52) U.S. Cl.
USPC .......................................................... 505/190

(58) Field of Classification Search
USPC .......................... 505/190, 220, 230, 629, 430
See application file for complete search history.

(56) References Cited

U.S. PATENT DOCUMENTS

| | | | |
|---|---|---|---|
| 3,449,818 A | 6/1969 | Lowe et al. | |
| 5,358,929 A * | 10/1994 | Fujikami et al. | 505/100 |
| 5,949,131 A | 9/1999 | Sato et al. | |
| 6,750,399 B1 | 6/2004 | Daumling | |
| 2002/0020546 A1 | 2/2002 | Ueyama et al. | |
| 2005/0067184 A1 | 3/2005 | Jang | |
| 2006/0066429 A1 * | 3/2006 | Kasten | 335/296 |
| 2010/0184604 A1 * | 7/2010 | Roden et al. | 505/237 |

FOREIGN PATENT DOCUMENTS

| | | |
|---|---|---|
| DE | 19804342 A1 | 8/1999 |
| EP | 0545608 A2 | 6/1993 |
| EP | 0556837 A1 | 8/1993 |
| EP | 1053193 B1 | 11/2000 |
| JP | 01-134881 A | 5/1989 |
| JP | 02-186575 A | 7/1990 |
| JP | 08-138820 A | 5/1996 |
| WO | 2006111170 A2 | 10/2006 |
| WO | 2008148390 A1 | 12/2008 |

* cited by examiner

*Primary Examiner* — Colleen Dunn
(74) *Attorney, Agent, or Firm* — Pearne & Gordon LLP

(57) ABSTRACT

The invention relates to a superconducting element joint comprising a joint between two superconducting elements comprising at least one direct SC-SC transition joint. By the invention an improved superconducting element joint may be obtained.

The invention also relates to a process for providing such superconducting element joint and a superconducting cable system comprising such superconducting element joint.

21 Claims, 10 Drawing Sheets

SUPERCONDUCTING ELEMENT JOINT, A PROCESS FOR PROVIDING A SUPERCONDUCTING ELEMENT JOINT AND A SUPERCONDUCTING CABLE SYSTEM

TECHNICAL FIELD

The invention relates to a superconducting element joint, a process for providing such superconducting element joint and a superconducting cable system comprising such superconducting element joint.

BACKGROUND ART

Prior art superconducting element joints are usually provided by inserting an insert element with each end connecting each piece of superconducting cable to thereby form a double joint.

Such superconducting element joints are e.g. known from US2005/0067184A1.

In the prior art several types of superconducting elements which are desired to joint is known. Such super conducting elements include superconducting busbars (in the following just called 'busbars'), superconducting cables, layers of superconducting cables and other similar elements.

For long length cable systems the technology of cable joining is necessary because the individually superconducting elements cannot be produced in sufficient length without joining/splicing elements The superconducting cables known today includes in particular 3 major types, namely cold-dielectric co-axial design, warm-dielectric single-phase cables, and tri-axial cable design, i.e. three concentric phases centered around a carrier, former or similar and surrounded by a concentric electrical screen e.g. as described in WO06/111170, U.S. Pat. No. 6,750,399 and/or in EP1053193

The tri-axial cable design has several advantages over other HTS cable designs. The advantages over a cold-dielectric co-axial design include:

Reduced use of superconducting material (e.g. by 34-50%) leading to reduced cost and reduced energy loss.
Reduced use of cryogenic envelope materials and cold surface (e.g. by 30-50%) leading to reduced cost and increased energy efficiency.

Advantages of the tri-axial cable design compared to warm-dielectric single-phase cables include:

Essentially no external magnetic fields creating disturbances externally to the cable.
Improved relation between the electrical properties of inductance and capacitance leading to longer critical lengths, improved stability and reduced load-dependant voltage drops.
Reduced magnetic fields internally in the cable leading to lower energy losses and improved performance of the superconducting materials.
Reduced use of cryogenic envelope materials and cold surface (e.g. by a factor 30-50%) leading to reduced cost and increased energy efficiency.
Reduced number of cryogenic envelopes leading to fewer welding and fabrication steps, lower fabrication costs and increased reliability.

Disadvantages of the tri-axial cable design compared to two alternative designs may be the following:

More complex cable design and termination design than the co-axial cold dielectric and the warm-dielectric single phase leading to higher risk in manufacturing and in utilization.

As indicated above prior art have dealt with plug-in type of conductor splice, which constitute an insert or transition piece, either in Cu, another low resistivity conductor or a composite insert made where the superconducting wires/tapes are embedded in a matrix. Although using a plug-in type insert reduces the complexity of the splice handling it introduces at least two conductor joints for each conductor and in the case of a Cu transition piece, it also introduces an extended ohmic transition. Another point that is not addressed in prior art is the undesired ac loss of the prior art conductor joint. Ohmic losses can be reduced by forced cooling. However, for a long cable the ohmic joint losses accumulate and it will have to be reduced or removed by cooling together with other losses. In this case the ohmic loss adds to the cryogenic losses as well as the magnetically generated ac losses of a superconducting ac cable. For a dc cable the contribution to the resulting loss is even more significant because no losses are generated in the superconductor.

DISCLOSURE OF INVENTION

The invention relates to a superconducting element joint which result in less Ohmic and/or cryogenic losses than the prior art plug-in type of conductor splice/joint described above. In particular the superconducting element joint of the invention has very good properties with respect to mechanical strength, current rating, and fault current as well as high voltage capabilities.

This invention also relates to a process for providing a superconducting element joint which is relatively simple. The process for providing a superconducting element joint may preferably comprise a joining method that provides the level of technology that enables joining of HTS superconducting cables of different geometries, e.g. coax, triax, multi phase as well as DC cables. The solution provides a joint (the superconducting element joint) that is generally as strong as or stronger than the virgin cable with respect to mechanical strength. Also it has been found that the current related properties of the superconducting element joint is very good and that the current rating, and fault current as well as high voltage capabilities are substantial equal to or improved compared to these properties of the virgin cable. Furthermore the cable may be kept as slim as possible compared to the virgin cable.

The terms joint, joint structure, element joint and splicing are used interchangeable to mean a connecting structure between two elements. The super conducting element joint may comprise one single joint or two or more joints, where juxtaposed elements of the superconducting element are preferably only involved in one joint structure.

The terms tape and wire are used interchangeable to mean any type of superconducting tape/wire (SC/HTS). The term wire means a superconducting wire having any cross-sectional shape such as round, oval. Square and etc. A tape is a wire which is relatively flat i.e. having a cross-sectional shape with an aspect ration of about 2 or more:1. The term wire includes tapes.

This invention offers in one embodiment a path to join cables as well as a stringent scheme of how to dimension the size of the HTS-HTS overlap (or HTS-HTS-HTS) in order to obtain a desired and or a predetermined dc and ac characteristic. In one preferred embodiment of the invention is provided a superconducting element joint comprising a staggering arrangement, which is suggested as an option in order to obtain an ultimate slim overall cable joint dimension as well as distributing the thermal load longitudinal from the ohmic dissipation however small this may be. In one embodiment the superconducting element joint is provided in the form of an all in one three-phase cable joint.

SC means superconducting or superconductor.

SC tape/wire is any superconducting wire in a broad sense, and includes also wires that also incorporate non-superconducting materials as a natural and integrated part of the wire such as but not limited materials such as the wire matrix, substrate, laminate, solder etc.

HTS means high temperature SC tape/wires.

SC-SC or a multiple SC-SC-SC-joint is understood to include any one or a multitude of joints that is formed by SC tape/wires including their partially non-superconducting components, even if the transition strictly speaking is not electrically superconducting.

Virgin conductor means plain SC or normal tape/wire.

Virgin cable means a cable without any joints.

The term "staggered joints" means that the joints is at least partly dislocated with respect to each other in the longitudinal direction of the cable The invention is as defined in the claims and as described herein.

The superconducting element may be any kind of superconducting element preferably comprising at least one SC wire, such as superconducting busbars, superconducting cables, layers of superconducting cables, phases/neutral, conductors and other similar elements.

The term 'phases' includes any non-neutral phases and any neutral phases unless other is mentioned. The term 'neutral' means a neutral phase. Generally a neutral phase will have the same electrical potential as ground, and most often a neutral phase will be grounded.

The superconducting joint of the invention comprises at least one direct SC-SC transition joint. A direct SC-SC transition joint also called a superconductor-superconductor joint is defined as being a joint comprising two end sections of superconducting elements joint together without an intermediate section of a non-superconducting conductor (normal conductor). It is understood that a direct SC-SC includes joints where a minor normal conducting material occurs between the actual superconducting sections as long as the normal material is part of the joining means, e.g. solder, welding consumables, glue etc. or the material is an integrated part of the conductor to be joined, e.g. laminate, reinforcement, seals, coating etc. For example will HTS tapes/wires laminated with a soldering material (e.g. SS) and soldered together be regarded as a direct SC-SC joint in this context although there is no 100% superconducting connection between the actual superconducting parts theoretically. A direct SC-SC is characterized by being the opposite of a joint/connection where an intermediate section is used and where the intermediate section leads to at least two joints, one in each end of the intermediate section.

The SC-SC transition joint may be between to identical superconducting elements or between two different superconducting elements, e.g. wire-wire, layer-layer, phase-phase, cable-cable, cable-busbar and etc.

According to an embodiment of the invention the superconducting element joint comprises a direct SC-SC transition joint being provided between two joining ends and where one or both joining ends have at least one superconducting strand or superconducting layer.

The superconducting elements comprising the at least one direct SC-SC transition joint may be any kind of superconducting elements, and thy may be identical or they may differ from each other. In most situations the superconducting element joint will comprise a direct SC-SC transition joint between two superconducting elements having essentially identical cross sectional structure.

In one embodiment at least one of the superconducting elements is a cable comprising at least 3 phases plus a neutral. In this embodiment it may be desired that all of the phases including neutral being joint to another superconducting element with joints comprising or consisting essentially of direct SC-SC transition joints. In one embodiment the 3 phases being joined to another superconducting element with joints comprising or consisting essentially of direct SC-SC transition joints. The neutral may simply be grounded and need not being joint to another superconducting element.

In one embodiment at least one of the superconducting elements comprises at least a multi phase cable, such as a 2, 3, 4 or 5 phase cable.

In one embodiment at least one of the superconducting elements comprises a DC (Direct Current) cable, such as for example a superconducting element for a HVDC or high-voltage, direct current electric power transmission systems In one embodiment at least one of the superconducting elements comprises an AC (Alternating Current) cable.

In one embodiment at least one of the superconducting elements comprises a triax cable. A triax cable is a cable comprising 3 coaxial phases for example such as shown in FIG. 1.

Generally it is desired that at least one of the superconducting elements comprises a superconducting cable i.e. a cable arranged to transmit current via a superconducting material. Preferably both of the superconducting elements are superconducting cables.

One or more of the superconducting elements may comprise one or more non-superconducting element. The non-superconducting elements may for example be elements of traditionally conductive material, such a metals e.g. Cu. The non-superconducting elements may for example be wrapped totally or partly around one or more superconducting elements, e.g. for reducing risk of current leak or for reducing the risk of break down due to local heating.

In one embodiment the direct SC-SC transition joint is a joint between two coaxial cables.

In one embodiment the direct SC-SC transition joint is a joint between multi-phase cables of equal or different cross-sectional structure.

In one embodiment the direct SC-SC transition joint is a joint between two DC cables of equal or different cross-sectional structure.

Examples of cross-sectional structures of superconducting elements which may be joined in a direct SC-SC transition joints are the cross-sectional structures of the superconducting single phase or multi-phase cable described in any one of WO06/111170, U.S. Pat. No. 6,750,399 and/or in EP1053193.

In one embodiment the superconducting element joint has one or more superconductor-to-superconductor direct SC-SC transition joints (SC-SC joint) where it is understood that said SC-SC joint may include non superconducting material that in a natural way is an integrated part of said SC tape/wire, e.g. the tape/wire matrix, substrate, laminate as well as solder but not limited to these materials.

In one embodiment the superconducting element joint is a joint between two superconducting cables or busbars of the type single phase or a multi-phase cable where the phases as well as the neutral/screen is arranged concentrically around each other (e.g. a so-called triax cable or a coax cable) characterized by the cable ends being connected/joined with only one joint (in field joint as opposed to a prefabricated insert) and where said joint is obtained by a number of individual phase-joints (or neutral-joint) and where said phase-joint (or neutral-joint) is obtained by a number of layer-joints and where said superconducting layers or phases, in case both said individual phase layers or cable phases (or neutral) are superconducting, contains at least a direct SC-SC transition joint as defined above. Preferably all of the superconducting joints are direct SC-SC transition joints.

In one embodiment where the superconducting element joint comprises two or more phase/neutral joints, it is desired that these individual phase/neutral joints have spatial locations which are staggered with respect to every other phase/neutral joint in said superconducting element joint. Thereby the individual joint may be simpler to cool and the structure may be less bulky—the superconducting element joint of the final cable may even be a slim as the virgin cable.

In one embodiment the superconducting element joint comprises joint of layers, such as layers of superconductive wires. The layers of superconductive wires may be joined in layer-by-layer-joints with corresponding layers of superconductive wires. These layer-by-layer-joints may preferably be direct SC-SC transition joints. In one embodiment the superconducting element joint comprises joint of layers where the joint of layers (layer-joints) are individually joint within each phase/neutral in said superconducting element joint. The layer-joints may be layer-by-layer-joints the joints preferably being direct SC-SC transition joints.

In one embodiment the layer-joints are staggered within each phase/neutral in said superconducting element joint.

In one embodiment the superconducting elements comprise at least one cable comprising dielectric between phases and between non-neutral-phase and neutral in said superconducting element joint wherein said dielectric between phases and between phase and neutral is similar to what it is in cable ends of said superconducting elements. Thereby the cables may be simple to join.

In one embodiment the superconducting elements comprise at least one cable comprising dielectric wherein said dielectric is a wrap-on type dielectric or a solid dielectric, which can easily be removed totally or partly for providing the superconducting element joint.

The dielectric may be any kind of dielectric which is useful in superconducting cables, such as the dielectrics which are described in prior art superconducting cable publications such as in any one of WO06/111170, U.S. Pat. No. 6,750,399 and/or in EP1053193.

In one embodiment the superconducting elements comprises at least one cable comprising dielectric wherein said dielectric is a compound dielectric characterized by a layered structure and impregnated with cooling fluid. Such a material is e.g. described in applicants co-pending WO application PCT/DK2008/000208.

In one embodiment the superconducting elements comprises at least one cable comprising dielectric wherein said dielectric is joint in a dielectric joint, said dielectric joint. The dielectric joint may preferably be dislocated in the longitudinal direction of the cable (staggered) with respect to said direct SC-SC transition joint(s).

In one embodiment each of the superconducting elements comprises a former, said formers being joined in a former joint. The former joint preferably being a joint between former ends of the superconducting elements and the former joint preferably being a joint with an insert that ensures a smooth physical transition between the said cable ends either by prefabrication or is built up to present a smooth physical transition.

The formers may in principle be joined by any methods, such as the methods which are described in prior art superconducting cable publications such as in any one of WO06/111170, U.S. Pat. No. 6,75,0399 and/or in EP1053193.

In one embodiment the former joint comprises a former insert for said joint where the former insert is shaped/formed (dimension, hole size etc.) with the intend by means of forced flow to functioning as heat exchanger and thermal anchor/thermal arrestor for parts of or for the complete of said superconducting element joint.

In one embodiment the former joint comprises a former insert characterized by an OD (radial dimension) that leads to a joint OD being the same as the superconducting elements (e.g. parent cable/busbar), or a former insert that is narrower by a predefined amount in order to compensate for the thickness increase anticipated by the subsequent build of the joint.

In one embodiment formers joint in said former joint is of a material preferably comprising at least one of stainless steel and fiber reinforced material.

The formers may have shape and form for example they may—individually of each other—be shaped as a cylinder, a spiral, wound elements, interlocked elements and/or corrugated pipe.

The formers and/or the former joint may—individually of each other—be fluid tight, semi-permeable or permeable to liquid e.g. to the cooling fluid.

In one embodiment at least one of the formers is a stainless steel interlocked former similar to the one used for the Triax and described in WO06/111170.

In one embodiment the superconducting element joint comprising one or more individual joints realized by any means such as by clamping, soldering, brazing, welding, gluing, etc.

The superconducting elements joint may comprise—e.g. in integrated form—any means of flow control, narrow section, forced flow heat exchanger, etc. The skilled person will know how to select and establish such means. Information for this may e.g. be found in any one of WO06/111170, U.S. Pat. No. 6,750,399 and/or in EP1053193.

In one embodiment the superconducting elements joint comprises a flexible superconducting connection, e.g. superconducting foil/wrap (for example 100 mm wide YBCO) is used to connect two superconducting layers/phases to provide a direct SC-SC transition joint.

The superconducting elements joint may preferably comprise at least one diagnostic access, for providing a simple diagnosis of the conducting and/or temperature of the individually elements of the cable(s).

In one embodiment the superconducting elements joint comprises cooling feed/drain or regenerative access (for regenerative cooling means).

In one embodiment the superconducting elements joint comprises single phase access (e.g. for cable with one phase only or for cable with more than one phase).

These assesses may be provided by one access or by two or more access. It is generally known in the art to provide access to make diagnosis, cooling and similar and the skilled person may find further information in prior art superconducting cable publications such as in any one of WO06/111170, U.S. Pat. No. 6,750,399 and/or in EP1053193.

In one embodiment the superconducting elements joint comprises a Triax direct SC-SC transition joint.

In one embodiment the superconducting elements joint comprises a joint-sleeve or clamp wherein said joint-sleeve or clamp in part being a heat exchanger ensuring a thermal anchor or temperature arrestor, in part being a first means of an optional regenerative cooling access. The joint-sleeve or clamp may e.g. have a prefabricated or prepared interface to a cooling device.

In one embodiment the superconducting element joint comprises a joint housing, which encloses said direct SC-SC transition joint. The joint housing may e.g. enclose the part of the superconducting elements comprising the superconducting element joint. The joint housing may e.g. facilitates diagnostics and/or regenerative cooling access/ports and/or other assesses to parts of the superconducting element joint.

In one embodiment the one or more direct SC-SC transition joint is an all in one housing joint. This means that all the direct SC-SC transition joint(s) are enclosed in one house (joint housing).

By the term "enclosed in one house" is meant that a house structure is formed in the length direction of the joined cables including the superconducting element joint joining the cable. The joint housing may or may not be closed. The joint housing may or may not comprise its own cooling medium supply/drain. In one embodiment the joint housing is open for flow of cooling medium along the superconducting element joint.

The joint housing may e.g. comprises a prefabricated interface to a cooler. The prefabricated joint-cooler interface may be arranged such that the cooling being exchanged by means of a cooling fluid (gas, liquid, slush or mixture of these).

In one embodiment the prefabricated joint-cooler interface is provided such that the cooling being exchanged by means of heat conduction through heat conducting material, typically metal the joint housing provides means electrically connecting a screen/shield to a cryostat and/or to the ground.

In one embodiment the joint housing is thermally insulated preferably by at least one of vacuum, partly vacuum, partly foam, aerogel or similar nano-particle solid or liquid thermal insulation, fully foam insulated, aerogel or similar, Triax thermal insulation and mixtures thereof.

In one embodiment the superconducting element joint is a cable joint, and the cable joint is slim/compact. The cable joint may e.g. have a cross-sectional area which is up to about 50%, such as up to about 20% such as up to about 5% larger than the cross-sectional area of the virgin cable. In one embodiment the cable joint has a radial dimension (OD-outer dimension) which is essential as the parent cable to be joint (the virgin cable).

In one embodiment said superconducting element joint is a cable joint that joins two cable end section of different dimensions.

In one embodiment the superconducting element joint comprises one of or a combination of two or more of shim foils, wraps, thermal insulator or heat resistant foils with the purpose of protecting the underlying layers from the heat impact of the joining process, e.g. soldering, or strengthening the mechanical characteristics of the joint, or electrically strengthening the joint with a good conductor or a superconductor.

In one embodiment the superconducting element joint consisting of SC-SC-SC transition joints where the SC-SC transition joint includes in a natural way any integrated parts of a superconducting tape/wire, i.e. including but not limited to, the non superconducting matrix, substrate, laminate, solder or other joining means.

In one embodiment the superconducting element joint comprises a SC-normal metal-SC joint including at least one of shim foils, wraps, smoothening foils, mechanically reinforcing foils, superconducting foils, clamp shells and/or similar.

In one embodiment the superconducting element joint comprises direct SC-SC transition joint of one or more phase conductors in a staggered fashion with respect to each other.

In one embodiment the superconducting element joint comprises direct SC-SC transition joint of one or more conducting layers. The conducting layers are joints in a staggered fashion with respect to each other. The one or more conducting layers preferably being selected from SC (super critical) conductors, normal (metal) conductors and other conductors such as polymer conductors, ceramic conductors and other.

In one embodiment the superconducting elements comprises at least one cable comprising at least two dielectric layers, wherein said dielectric layers are joint in dielectric joints, said dielectric joint preferably being dislocated in the longitudinal direction of the cable (staggered) with respect to at least one superconducting elements joint. The dielectric layers may be of materials as described above. The dielectric layers may be joined in dielectric joints as described above, said dielectric joint preferably being dislocated in the longitudinal direction of the cable (staggered) with respect to each other.

In one embodiment the superconducting element joint comprises one or more conductor-conductor direct SC-SC transition joint where the minimum overlap between SC-SC or SC-SC-SC is sufficient to provide an ac power loss of the overlap region at rated/nominal load is substantial equal to or lower than the ac power loss of the virgin SC at the same load.

In one embodiment the superconducting element joint comprises at least one direct SC-SC transition joint including a normal (non-superconducting) conductor where the minimum overlap between any number of normal conductors is sufficient to provide an ac power loss or a dc resistance of the overlap region at rated/nominal load which is substantial equal to or lower than the ac power loss or the dc resistance respectively of the virgin conductor at the same load.

In one embodiment the superconducting element joint comprises at least one direct SC-SC transition joint including a normal (non-superconducting) conductor where the minimum overlap between any number of normal conductors and superconductors is sufficient to provide an ac power loss or a dc resistance of the overlap region at rated/nominal load which is substantial equal to or lower than the ac power loss or the dc resistance respectively of either of the virgin conductors at the same load.

In one embodiment the superconducting element joint comprises a Cryoflex-Kapton field control.

In one embodiment the superconducting element joint comprises insulating material (dielectric), preferably the same as in virgin cable (corresponding insulation in non-joint section of the cable).

In one embodiment the superconducting element joint comprises insulating material different from in virgin cable. Thereby an increased or a decreased insulation effect in the superconducting element joint may be provided. In most situation it is desired that the insulating effect in the superconducting element joint is substantial equal to or higher than in the virgin superconducting elements which are joined.

In one embodiment the superconducting element joint comprises an insulation which is 0%-100% in thickness or thicker compared to virgin cable, preferably the insulation is at least 1%, such as at least 5%, such as at least 50% thicker than the thickness of the corresponding insulation in virgin cable (superconducting element(s)).

In one embodiment the superconducting element joint comprises an insulation comprising other field controlling means.

The superconducting element joint may be cooled using any cooling medium, such as the cooling medium described in prior art superconducting cable publications such as in any one of WO06/111170, U.S. Pat. No. 6,750,399 and/or in EP1053193.

In one embodiment the superconducting element joint is arranged to be cooled with liquid cryogen, e.g. forced flow/ conduction cooled.

In one embodiment the superconducting element joint is arranged to be cooled with gas.

In one embodiment the superconducting element joint comprises one or more liquid cryogen feed and exhaust.

In one embodiment the external of the superconducting element joint incorporates a heat exchanger (Cu clamp shell type).

In one embodiment the superconducting element joint comprises an internal flow control, such as holes narrower former section or similar with the purpose to increase cooling interaction with the cooling cryogen.

In one embodiment the superconducting element joint comprises a thermal anchor, such as a Cu clamp shell type forced flow cooling.

The invention also comprises a process for providing a superconducting element joint as described above. The process for providing a superconducting element joint comprises providing at least one pair of superconducting elements and joining said pair of superconducting elements is a direct SC-SC transition Joint.

In one embodiment the process of the invention comprises use of one or more of shim foils, wraps, (thin) clamp shell or similar for protection of underlying electrical insulator, fixation of first superconducting (or normal conducting) layer, enabling or facilitating soldering or other connecting means, mechanically or electrically reinforcement or other facilitating purposes.

In one embodiment the process of the invention comprises use of one or a combination of shim foils, wraps, thermal insulator or heat resistant foils with the purpose of protecting the underlying layers from the heat impact of the joining process, e.g. soldering, or strengthening the mechanical characteristics of the direct SC-SC transition joint, or electrically strengthening the direct SC-SC transition joint with a good conductor or a superconductor.

In one embodiment the process of the invention comprises staggering build/positioning of single layers on the superconducting elements.

In one embodiment the process of the invention comprises staggering build/positioning of each phase of the superconducting elements.

In one embodiment the process of the invention the superconducting elements comprising one or more conductors in the form of tapes/wires the process comprising a procedure of tying down/fixating the conducting tapes/wires by wrapping around with a low pitch an "aid" tape/wire or by using braided hoses, e. g. Cu.

In one embodiment the process of the invention the superconducting elements comprising one or more conductors (e.g. tapes/wires) the process comprising peel back insulation of 4 or more conductors together in one batch.

In one embodiment the process of the invention the superconducting elements comprising one or more conductors (e.g. tapes/wires) the process comprising a procedure of peeling back insulation from a bundle of conductors, bundle containing at least 3 or more conductors.

In one embodiment the process of the invention the superconducting elements comprising one or more conductors in the form of tapes/wires, the process comprising rewinding of a bundle of tapes/wires and the use or action of tying down the tapes/wires by temporarily winding tapes/wires around it to fixate the relevant HTS or Cu tapes/wires, i.e. a procedure of temporarily fixating tapes/wires.

In one embodiment the process of the invention the superconducting elements comprising one or more conductors (e.g. tapes/wires), the process comprising peel back insulation from at least one conductor from a first superconducting element, joining the conductor with a conductor of a second superconducting element, cover the provide conductor direct SC-SC transition joint with the peeled back insulation by sliding it back, and joining said peeled back insulation to a corresponding insulation on said second superconducting element to thereby provide an insulation joint (dielectric joint) which is staggered with respect to said conductor direct SC-SC transition joint.

The invention also relates to superconducting cable system comprising (1) a superconducting single phase or multi-phase cable, hereunder a triax cable,
(2) at least one joint,
(3) at least one termination,
(4) the relevant cooling means.

The superconducting cable system comprises at least one joint in the form of a superconducting element joint as described above.

The superconducting cable system also comprises a cooling system e.g. as described above and/or as described in prior art superconducting cable publications such as in any one of WO06/111170, U.S. Pat. No. 6,750,399 and/or in EP1053193.

The superconducting cable system also comprises a termination e.g. as described in prior art superconducting cable publications such as in any one of WO06/111170, U.S. Pat. No. 6,750,399 and/or in EP1053193.

BRIEF DESCRIPTION OF DRAWINGS

The invention will be explained more fully below in connection with a preferred embodiment and with reference to the drawings in which.

The figures are schematic and simplified for clarity, and they just show details which are essential to the understanding of the invention, while other details are left out. Throughout, the same reference numerals are used for identical or corresponding parts.

Some preferred embodiments have been shown in the foregoing, but it should be stressed that the invention is not limited to these, but may be embodied in other ways within the subject-matter defined in the following claims.

Figure 1:
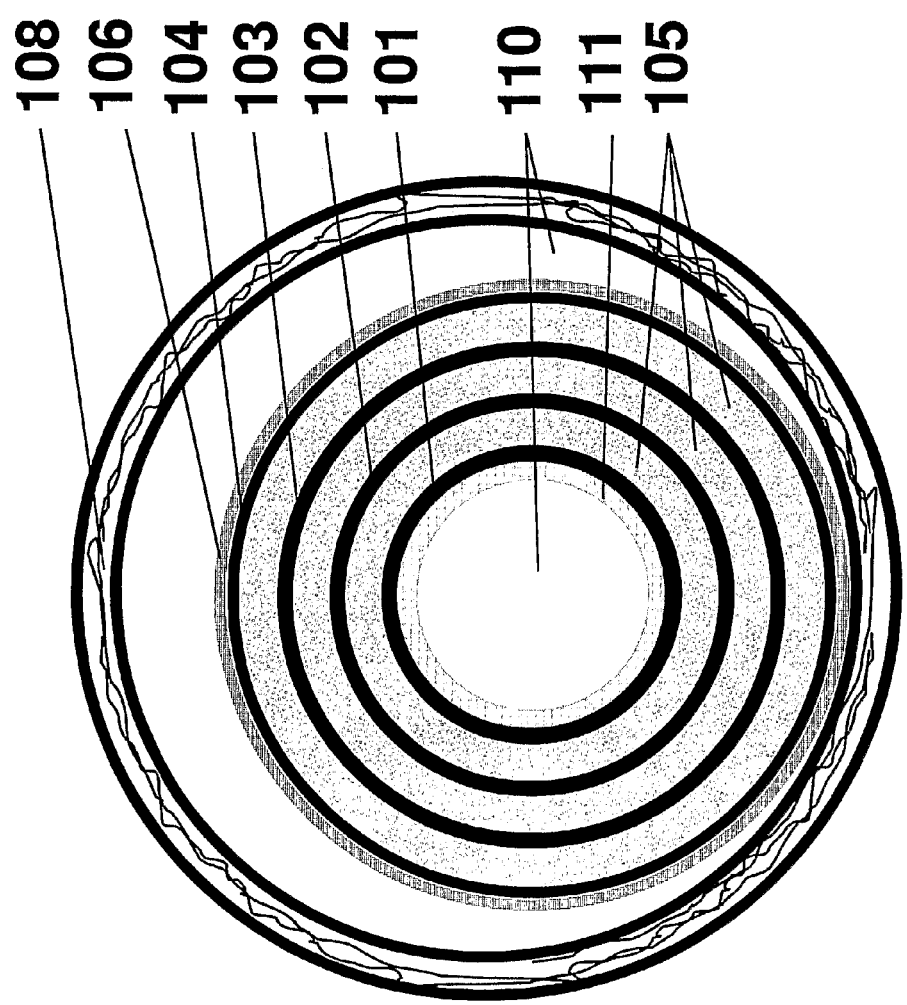
FIG. 1 shows a cross-sectional cut of a tri-axial cable design.

FIG. 1 shows a cross-sectional cut of a tri-axial cable design. The Triax comprises from inside out a cooling fluid 110, a former 111, a first phase 101, an insulation (dielectric) 105, a second phase 102, an insulation (dielectric) 105, a third phase 103, an insulation (dielectric) 105, a screen 104, a protection 106, a cooling fluid 110 and a thermal envelope 108. A cable having such structure is described in WO06/111170. Such cable type may e.g. constitute one or both superconducting element in the superconducting element joint of the invention.

Figure 2:
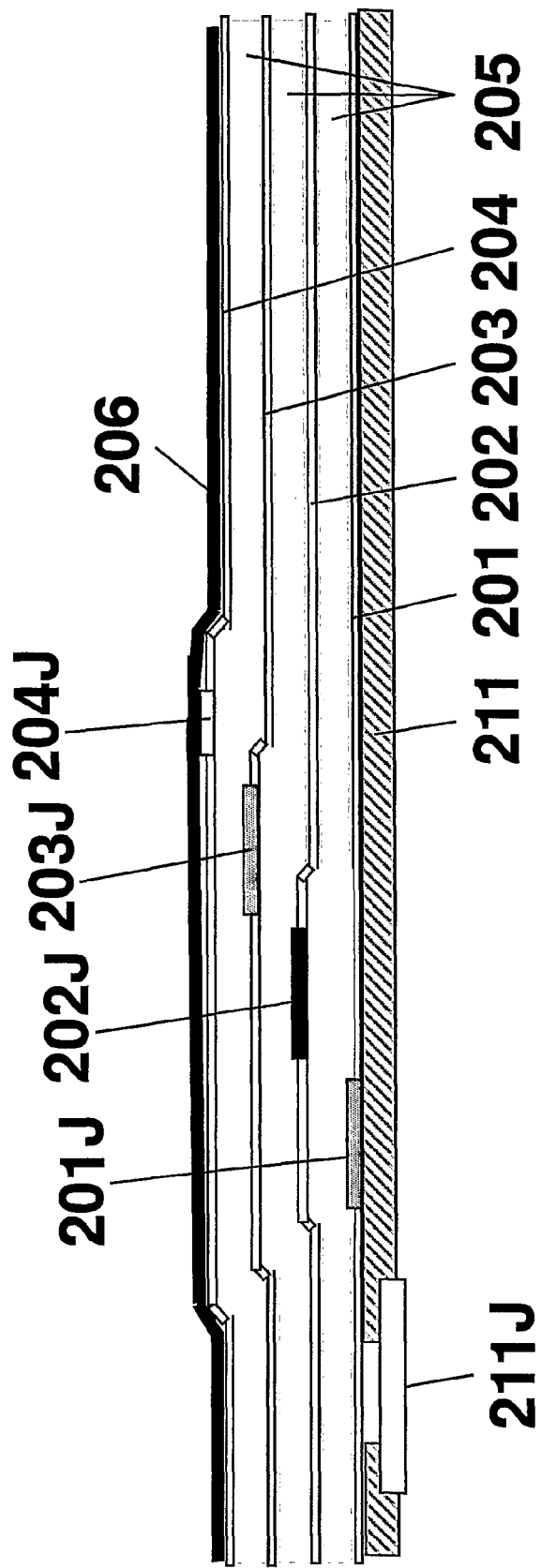
FIG. 2 shows a cross-sectional cut of a part of a tri-axial cable design with a superconducting element joint according to the invention.

FIG. 2 shows a cross-sectional cut of a part of a tri-axial cable design with a superconducting element joint according to the invention. 211 designates a former, 205 designates insulation, 206 designate a protection, 201, 202 and 203 designate different phases (non-neutral) and 204 designate a neutral phase (screen). 211J designates a former joint, 201J, 202J, 203J, and 204J designate SC-SC transition joints in the form of staggered joints. Between the individual phases may be a not shown dielectric. The dielectric may also be joined in the form of staggered joints e.g. dislocated with respect to other dielectric joints and/or dislocated with respect to one or more conductor joint.

Figure 3:
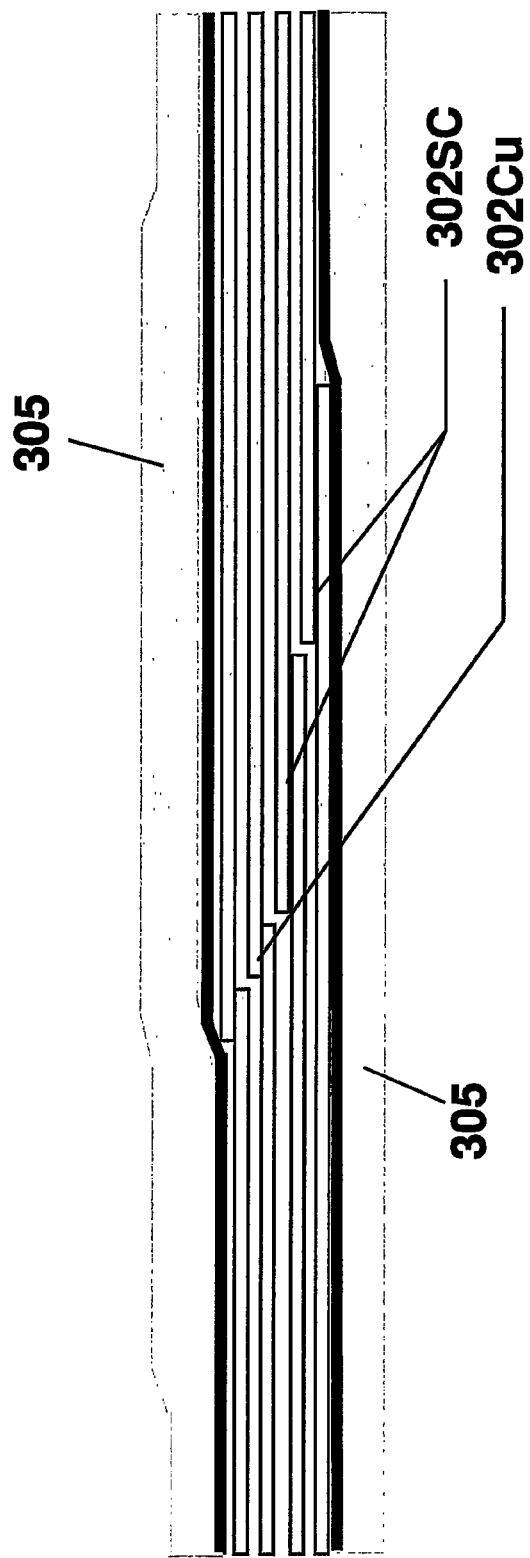
FIG. 3 shows a cross-sectional cut of a part of another cable design with a superconducting element joint according to the invention.

FIG. 3 shows a cross-sectional cut of a part of another cable design with a superconducting element joint according to the invention. 305 designates insulation, 302Cu designates a Cu conductor joint, 302SC designates a superconductive conductor joint.

Figure 4:
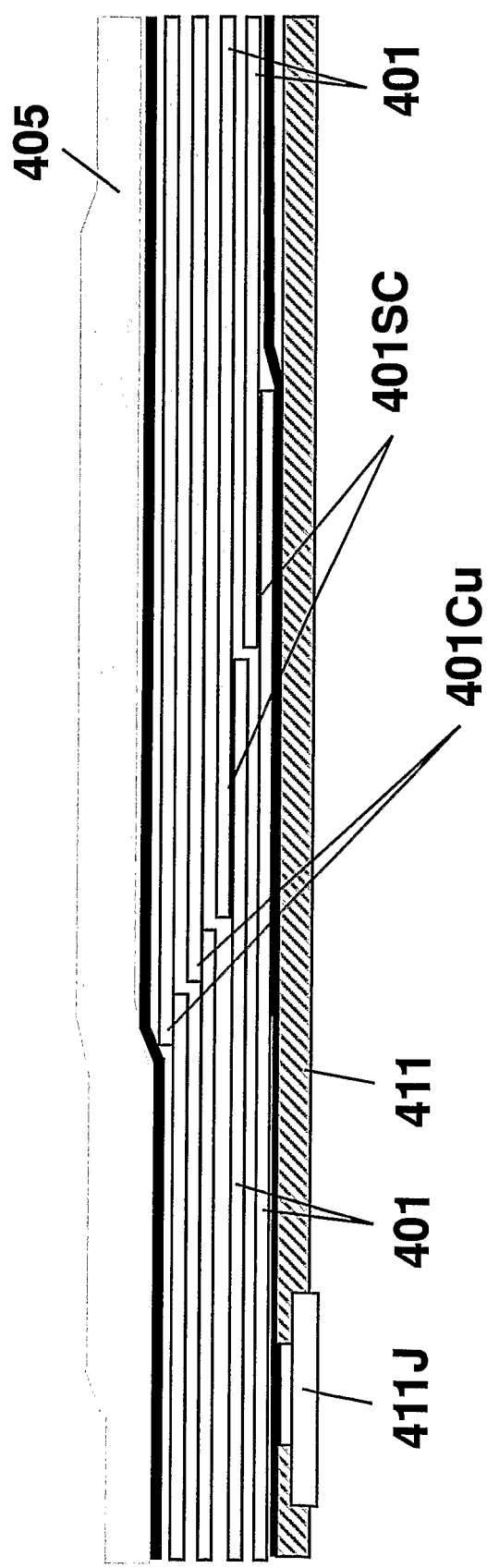
FIG. 4 shows a cross-sectional cut of a part of another cable design with a superconducting element joint according to the invention.

FIG. 4 shows a cross-sectional cut of a part of another cable design with a superconducting element joint according to the invention. 411 designates a former, 405 designates insulation, 401Cu designates a Cu conductor, 401/401SC designates a superconductive conductor. 211J designates a former joint.

Figure 5:
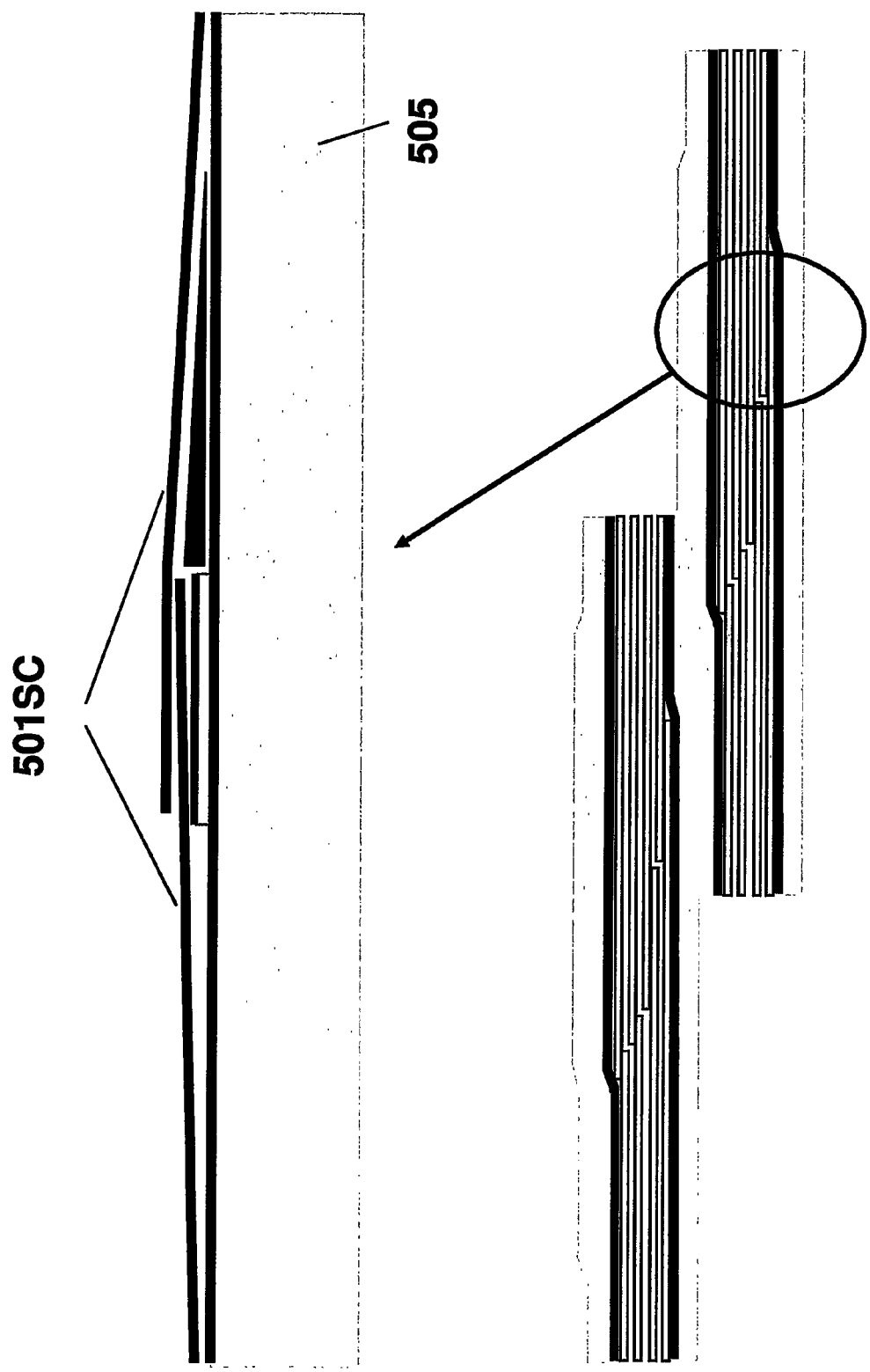
FIG. 5 shows a cross-sectional cut of a connecting between two SC wires in a SC-SC transition joint.

FIG. 5 shows a cross-sectional cut of a connecting between two SC wires in a SC-SC transition joint. 505 designates an insulator and 501 SC designates the two SC wires.

Figure 6:
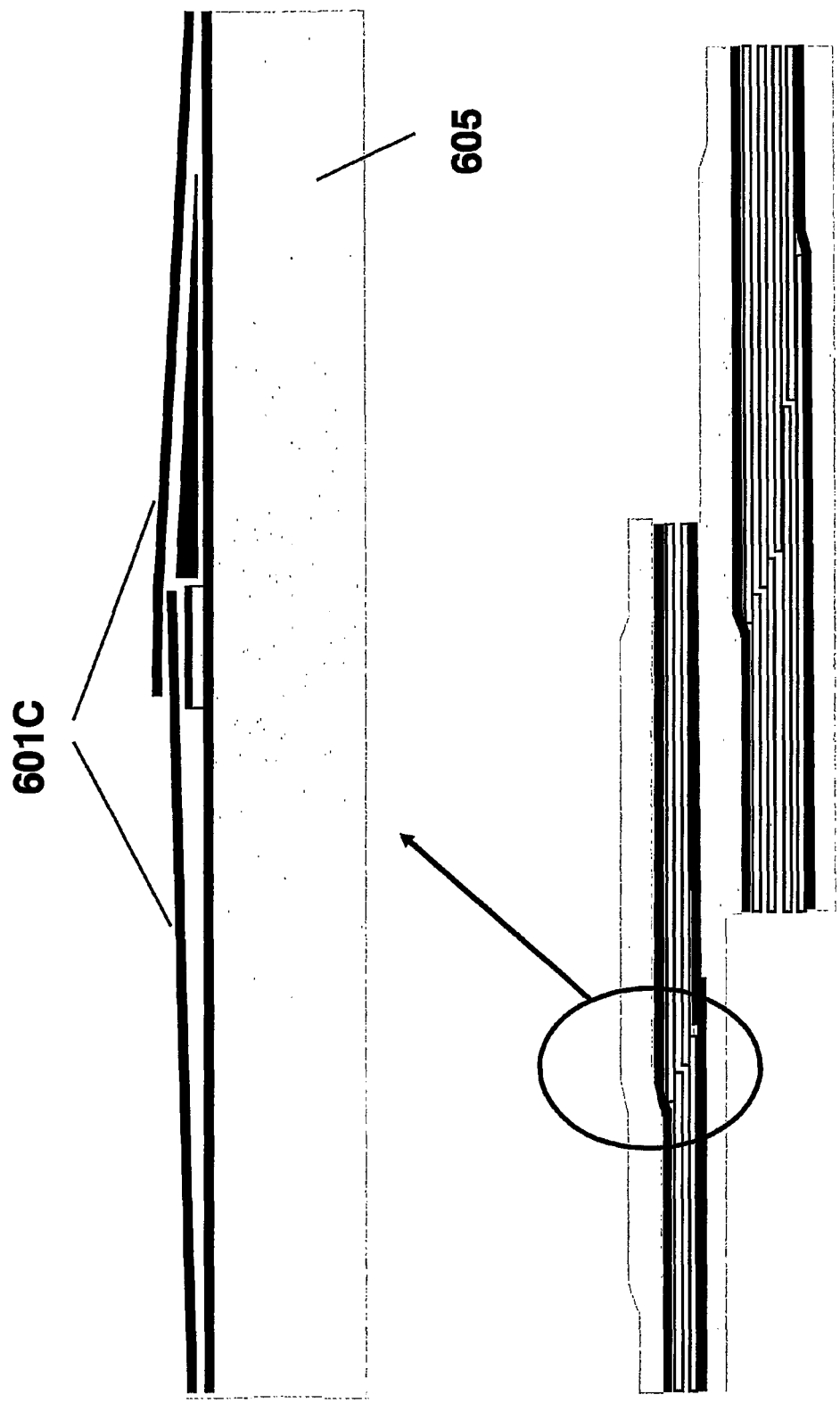
FIG. 6 shows a cross-sectional cut of a connecting between two Cu wires.

FIG. 6 shows a cross-sectional cut of a connecting between two Cu wires. 605 designates an insulator and 601 C designates the two Cu wires.

Figure 7:
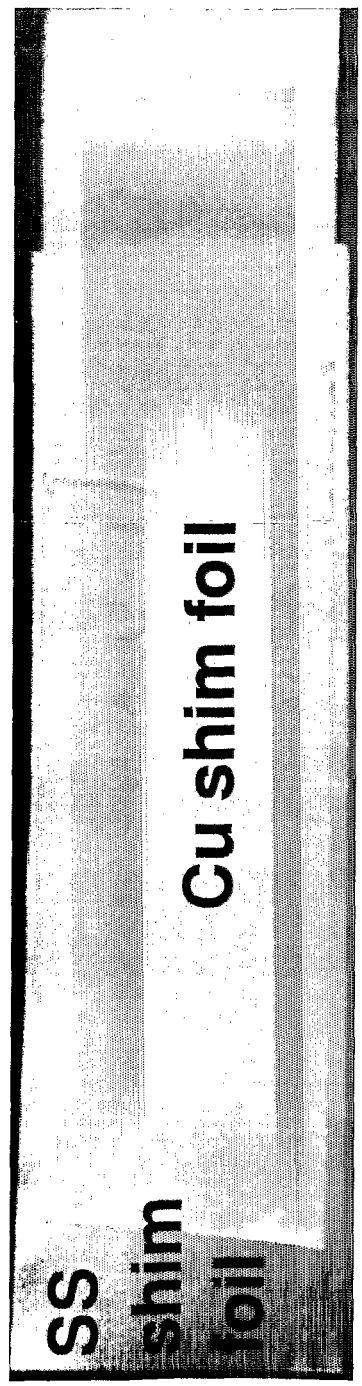
FIG. 7 shows a shim foil.

FIG. 7 shows a shim foil, which may be used in the invention as described above.

Figure 8:
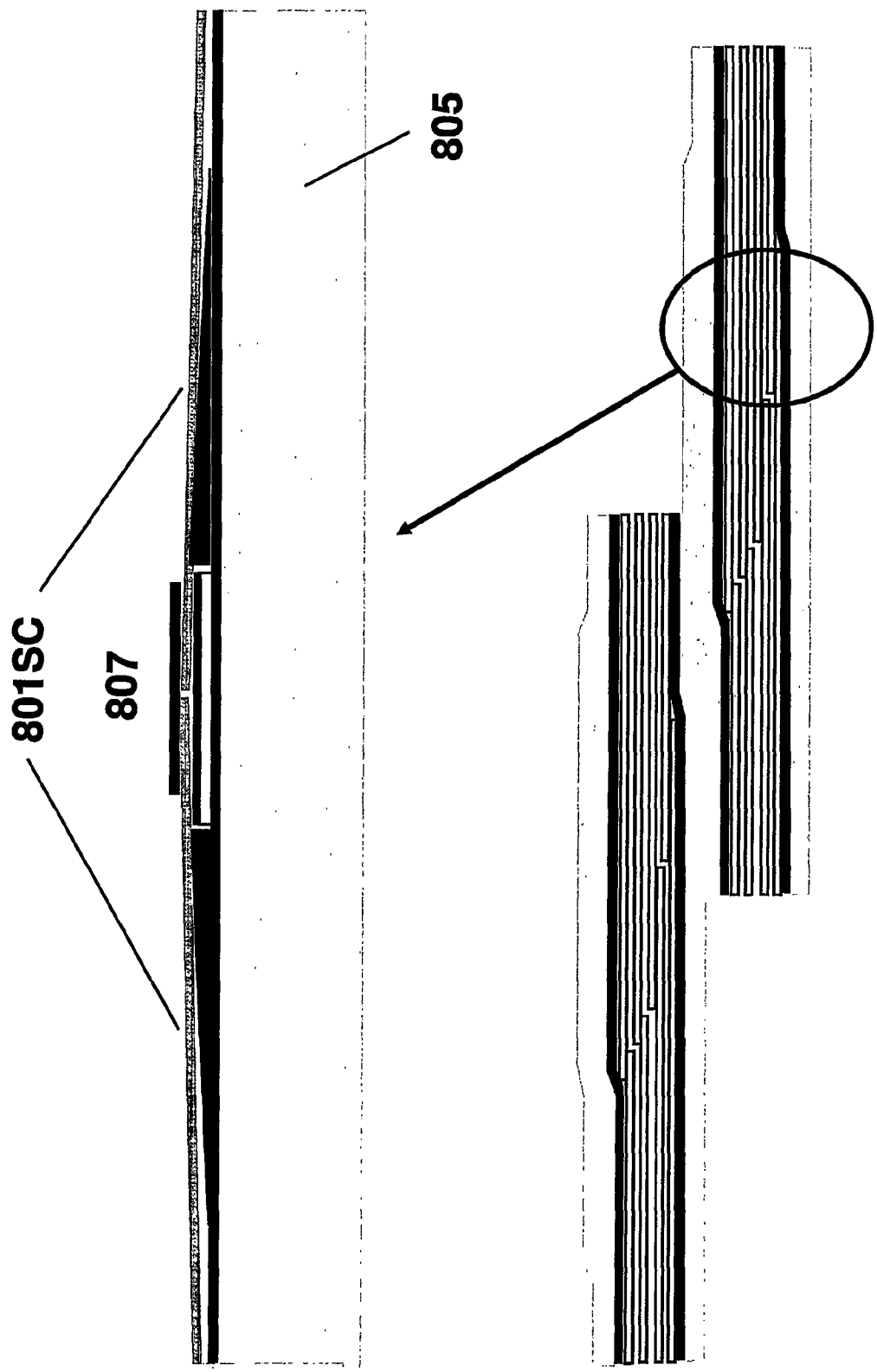
FIG. 8 shows a cross-sectional cut of a connecting between two SC wires in a SC-SC transition joint provided by a superconducting wrap.

FIG. 8 shows a cross-sectional cut of a connecting between two SC wires in a SC-SC transition joint provided by a superconducting wrap. 805 designates an insulator and 501 SC designates the two SC wires. 807 designates a shim foil, wrap or insert.

Figure 9:
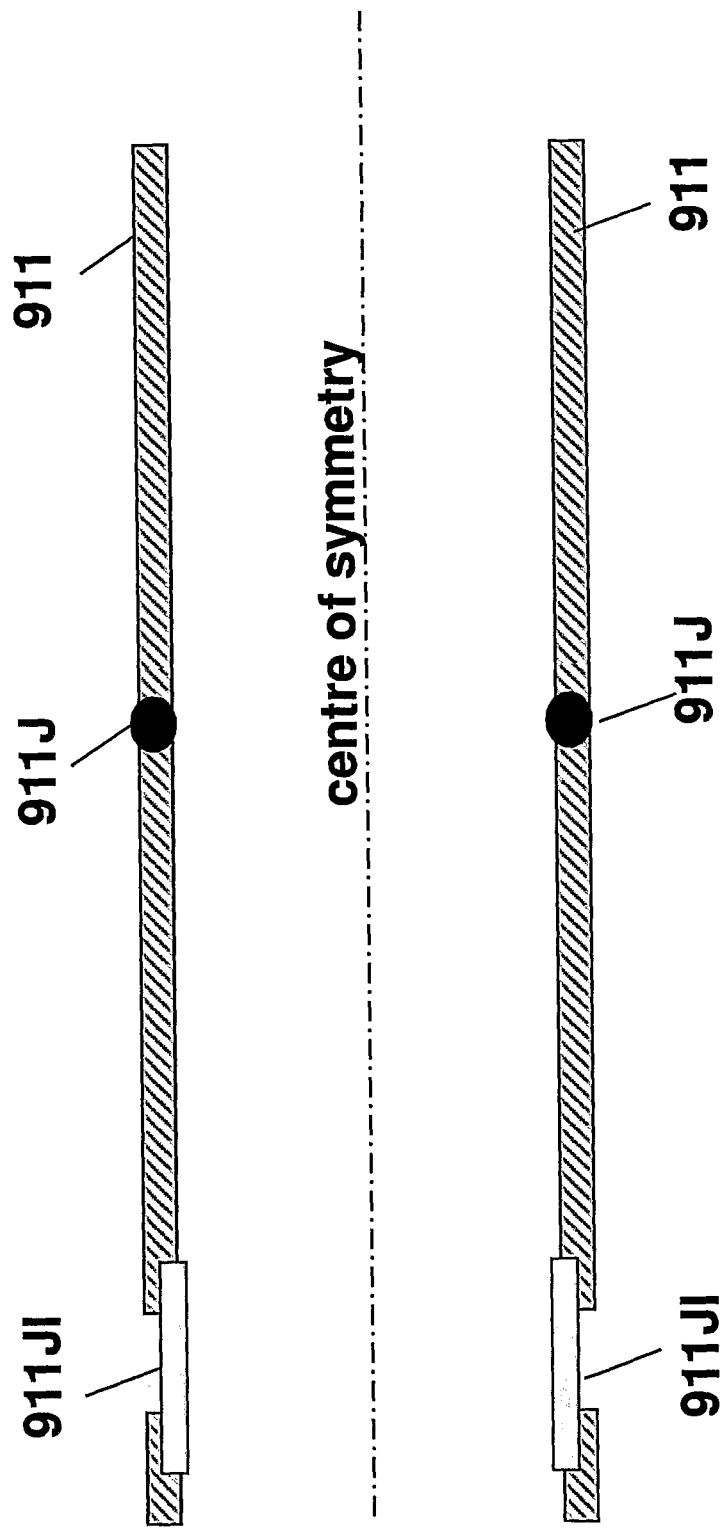
FIG. 9 shows a cross-sectional cut of a cable with a former.

FIG. 9 shows a cross-sectional cut of a cable with a former 911 comprising a welded joint 911J and a joint with a former insert 911JI.

Figure 10:
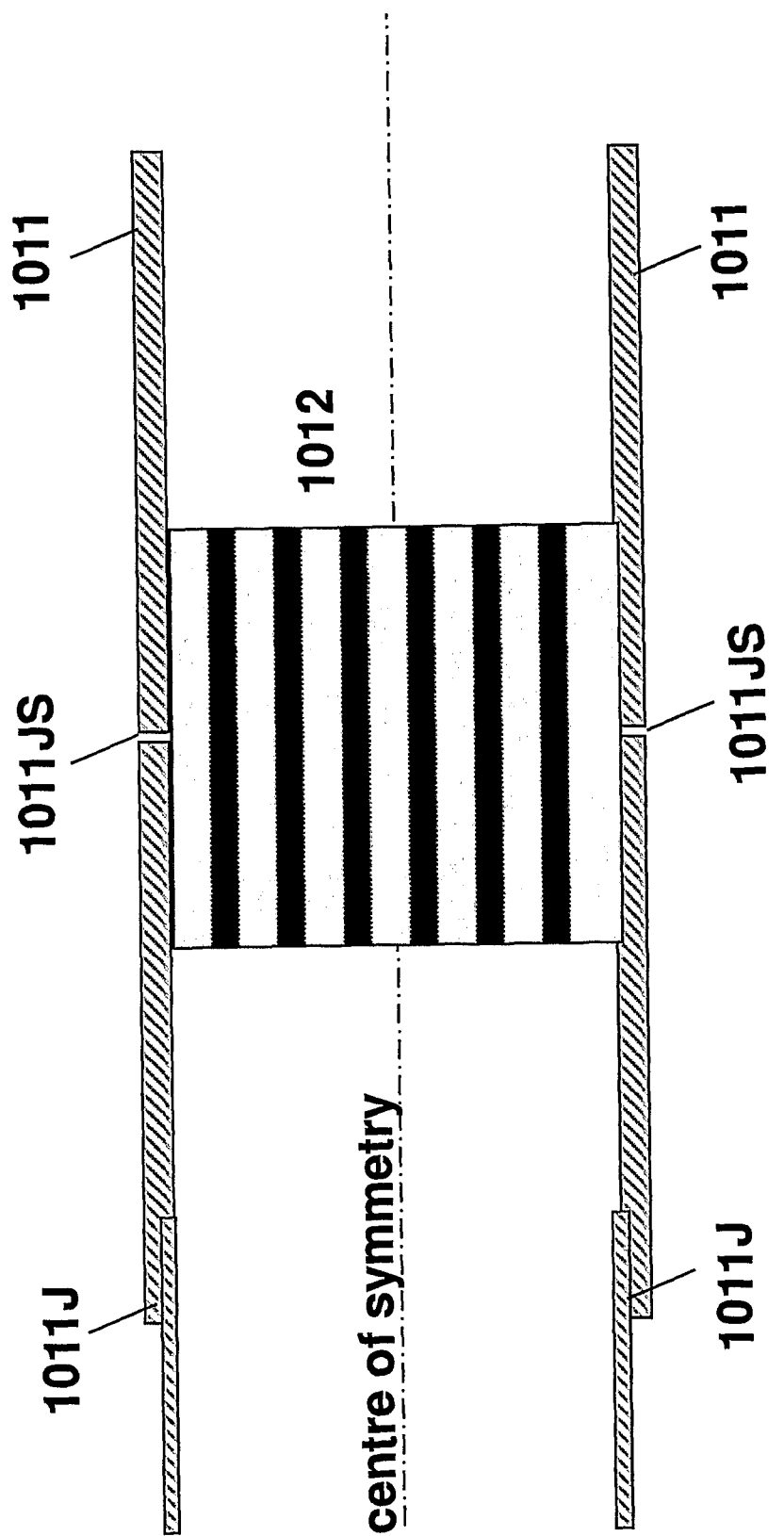
FIG. 10 shows a cross-sectional cut of a cable with a former.

FIG. 10 shows a cross-sectional cut of a cable with a former 1011 comprising an overlapping joint 1011J and a solder/press joint 1011JS comprising an insert 1012.

The figures are schematic and simplified for clarity, and they just show details which are essential to the understanding of the invention, while other details are left out. Throughout, the same reference numerals are used for identical or corresponding parts.

Some preferred embodiments have been shown in the foregoing, but it should be stressed that the invention is not limited to these, but may be embodied in other ways within the subject-matter defined in the following claims.

What is claimed is:

1. A superconducting element joint comprising a joint between two superconducting elements comprising at least one direct SC-SC transition joint, said superconducting elements each comprising a superconducting section, and wherein normal conducting material occurs between a superconducting section of one superconducting element and a superconducting section of the other superconducting element in said joint, said normal material being part of the material used to join the superconducting sections or an integrated part of the superconducting elements to be joined, the superconducting element joint comprising two or more phase/neutral joints, wherein said phase/neutral joints have spatial locations, which are staggered with respect to every other phase/neutral joint in said superconducting element joint.

2. A superconducting element joint as claimed in claim 1, wherein the direct SC-SC transition joint is a joint between multi-phase cables.

3. A superconducting element joint as claimed in claim 1, wherein the superconducting element joint is between two superconducting cables or busbars of the type single phase or a multi-phase cable where the phases as well as the neutral/screen is arranged concentrically around each other, wherein the cable ends being connected/joined with only one joint and where said joint is obtained by a number of individual phase-joints (or neutral-joint) and where said phase-joint (or neutral-joint) is obtained by a number of layer-joints and where said superconducting layers or phases, in case both said individual phase layers or cable phases (or neutral) are superconducting, contains at least a direct SC-SC transition joint as defined above.

4. A superconducting element joint as claimed in claim 1, wherein at least one of the superconducting elements comprises at least a triax cable.

5. A superconducting element joint as claimed in claim 1, wherein said superconducting element joint comprises joint of layers said layer joints are individually joint within each phase/neutral in said superconducting element joint, wherein said layer-joints are staggered within each phase/neutral in said superconducting element joint.

6. A superconducting element joint as claimed in claim 1, wherein the superconducting elements comprise at least one cable comprising dielectric between phases and between non-neutral-phase and neutral in said superconducting element joint wherein said dielectric between phases and between phase and neutral is similar to what is in cable ends of said superconducting elements.

7. The superconducting element joint as claimed in claim 1, wherein the superconducting elements comprises at least one cable comprising at least two dielectric layers, wherein said dielectric layers are joint in dielectric joints, said dielectric joint preferably being dislocated in the longitudinal direction of the cable (staggered) with respect to at least one superconducting elements joint or with respect to each other.

8. A superconducting element joint as claimed in claim 1, wherein said superconducting element joint is arranged to be cooled with liquid cryogen, and wherein said superconducting elements joint comprises a flow control unit arranged to control the flow of liquid cryogen.

9. A superconducting element joint as claimed in claim 8, wherein said flow control unit comprises in integrated form a narrow section or a forced flow heat exchanger.

10. A superconducting element joint as claimed in claim 1, wherein said superconducting elements joint comprises cooling feed/drain or regenerative access.

11. A superconducting element joint as claimed in claim 1, wherein said superconducting elements joint comprises a joint-sleeve or clamp, wherein said joint-sleeve or clamp in part being a heat exchanger ensuring a thermal anchor or temperature arrestor, in part being a first section of an optional regenerative cooling access.

12. A superconducting element joint as claimed in claim 11, wherein said joint-sleeve or clamp having a prefabricated or prepared interface to a cooling device.

13. A superconducting element joint as claimed in claim 1, wherein said superconducting element joint comprises a joint housing, which encloses said superconducting elements.

14. A superconducting element joint as claimed in claim 13, wherein said joint housing comprises a prefabricated interface to a cooler.

15. A superconducting element joint as claimed in claim 13, wherein said Joint housing is thermally insulated.

16. A superconducting element joint as claimed in claim 15, wherein said Joint housing is thermally insulated with at least one thermal insulation selected from the group of vacuum, partly vacuum, partly foam, aerogel, aerogel-like nano-particle solid, aerogel-like nano-particle liquid, fully foam insulation, thermal super insulation and mixtures thereof.

17. A superconducting element joint as claimed in claim 1, wherein said superconducting element comprises a cable, said superconducting joint being a cable joint, which have a cross-sectional area which is up to about 50% larger than the cross-sectional area of the virgin cable.

18. A superconducting element joint as claimed in claim 1, wherein said superconducting element comprises a cable, said super conducting joint being a cable joint, which have a cross-sectional area which is up to about 20% larger than the cross-sectional area of the virgin cable.

19. A superconducting element joint as claimed in claim 1, wherein said superconducting element joint is a cable joint, and wherein the cable joint has essentially same radial dimension (OD) as the parent cable to be joint.

20. A superconducting element joint as claimed in claim 1, wherein said superconducting elements joint comprises a Triax direct SC-SC transition joint.

21. A process for providing a superconducting element joint as claimed in claim 1, comprising providing at least one pair of superconducting elements and joining said pair of superconducting elements is a direct SC-SC transition joint, the superconducting elements comprising one or more conductors (e.g. tapes/wires), the process comprising peel back insulation from at least one conductor from a first superconducting element, joining the conductor with a conductor of a second superconducting element, cover the provide conductor direct SC-SC transition joint with the peeled back insulation by sliding it back, and joining said peeled back insulation to a corresponding insulation on said second superconducting element to thereby provide an insulation joint (dielectric joint) which is staggered with respect to said conductor direct SC-SC transition joint.

* * * * *

UNITED STATES PATENT AND TRADEMARK OFFICE
CERTIFICATE OF CORRECTION

PATENT NO.        : 8,463,341 B2                                               Page 1 of 1
APPLICATION NO. : 12/665095
DATED             : June 11, 2013
INVENTOR(S)       : Roden et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 727 days.

Signed and Sealed this
Eighth Day of September, 2015

Michelle K. Lee
*Director of the United States Patent and Trademark Office*